United States Patent [19]
Guardado

[11] Patent Number: 6,034,357
[45] Date of Patent: Mar. 7, 2000

[54] APPARATUS AND PROCESS FOR MEASURING THE TEMPERATURE OF SEMICONDUCTOR WAFERS IN THE PRESENCE OF RADIATION ABSORBING GASES

[76] Inventor: Julio L. Guardado, 1577 Country Club Dr., Milpitas, Calif. 95035

[21] Appl. No.: 09/093,493

[22] Filed: Jun. 8, 1998

[51] Int. Cl.$^7$ .................................................. C23C 16/00
[52] U.S. Cl. .......................... 219/390; 219/413; 219/494; 392/416; 392/418
[58] Field of Search .................................... 219/390, 401, 219/405, 411, 412, 413, 494, 705, 707, 710; 118/724, 725, 728, 50.1; 392/391, 399, 416, 418; 374/120, 121, 125; 438/660, 663

[56] References Cited

U.S. PATENT DOCUMENTS

| | | | |
|---|---|---|---|
| 4,755,654 | 7/1988 | Crowley et al. | 118/725 |
| 5,252,807 | 10/1993 | Chizinsky | 219/390 |
| 5,367,145 | 11/1994 | Takagi | 219/494 |
| 5,369,253 | 11/1994 | Kuwata et al. | 219/707 |
| 5,423,184 | 6/1995 | Eggemar | 374/121 |
| 5,430,272 | 7/1995 | Takahashi | 219/413 |
| 5,624,590 | 4/1997 | Fiory | 219/390 |
| 5,710,407 | 1/1998 | Moore et al. | 118/725 |
| 5,830,277 | 11/1998 | Johnsgard et al. | 118/725 |
| 5,837,555 | 11/1998 | Kaltenbrunner et al. | 118/724 |

*Primary Examiner*—Teresa Walberg
*Assistant Examiner*—Fadi H. Dahbour

[57] ABSTRACT

An apparatus and method for determining the temperature of a semiconductor wafer in a thermal processing chamber in the presence of a radiation absorbing gas, such as a vapor, is disclosed. The apparatus includes a temperature sensing device which senses the amount of electromagnetic radiation being emitted by a wafer being heated and a gas sensing device which senses the amount of a gas present within the chamber. The system further includes a controller which is placed in communication with the temperature sensing device and the gas sensing device. The controller is configured to determine a correction factor based upon the amount of gas contained within the chamber. The correction factor in combination with information received from the temperature sensing device are then used to determine the temperature of the wafer.

11 Claims, 1 Drawing Sheet

APPARATUS AND PROCESS FOR MEASURING THE TEMPERATURE OF SEMICONDUCTOR WAFERS IN THE PRESENCE OF RADIATION ABSORBING GASES

FIELD OF THE INVENTION

The present invention is generally directed to a method and to an apparatus for measuring the temperature of semiconductor wafers while said wafers are being heated in a thermal processing chamber. More particularly, the present invention is directed to an apparatus for determining the temperature of a semiconductor wafer in a thermal processing chamber that contains a gas, such as steam. Specifically, the temperature of the wafer is determined by not only sensing thermal radiation being emitted by the wafer but also by sensing the amount of gas contained in the chamber.

BACKGROUND OF THE INVENTION

A thermal processing chamber as used herein refers to a device that rapidly heats objects, such as semiconductor wafers. Such devices typically include a substrate holder for holding a semiconductor wafer and a light source that emits light energy for heating the wafer. During heat treatment, the semiconductor wafers are heated under controlled conditions according to a preset temperature regime.

Many semiconductor heating processes require a wafer to be heated to high temperatures so that various chemical and physical transformations can take place as the wafer is fabricated into a device. During rapid thermal processing, which is one type of processing, semiconductor wafers are typically heated by an array of lights to temperatures, for instance, from about 100° C. to about 1,200° C., for times which are typically less than a few minutes. During these processes, one main goal is to heat the wafers as uniformly as possible.

Besides heating semiconductor wafers, thermal processing chambers are also used to chemically react the wafers with other components contained within the chamber such as gases. For instance, various gases can be circulated through the thermal processing chamber which react with the surface of the semiconductor wafer during heating to form a desired film or coating on the wafer. For example, in one embodiment, steam can be present within the chamber for forming oxidation coatings on the wafer.

For monitoring the temperature of the semiconductor wafer during heat treatment and other processes, thermal processing chambers typically include radiation sensing devices, such as pyrometers, that sense the radiation being emitted by the semiconductor wafer at a selected wavelength. For instance, a thermal processing chamber can contain a single pyrometer or a plurality of pyrometers which sense radiation being emitted by a wafer either at a single location or at multiple locations. By sensing the thermal radiation being emitted by the wafer, the temperature of the wafer can be calculated using, for instance, Planck's Law.

In the past, however, problems have been experienced in determining the temperature of semiconductor wafers contained in thermal processing chambers using pyrometers when the processing chambers contain radiation absorbing gases, such as steam. In particular, the gases can absorb some of the thermal radiation being emitted by the wafer before the thermal radiation can be detected by the pyrometer. Thus, the amount of thermal radiation sensed by the pyrometer is less than the actual amount being emitted by the wafer, which leads to inaccurate temperature readings.

As such, a need currently exists for a process for determining the temperature of a semiconductor wafer in a thermal processing chamber when radiation absorbing gases are present within the chamber. In particular, a need exists for a system for determining the temperature of wafers in thermal processing chambers using pyrometers, when gases such as steam are present. Precise temperature determinations in thermal processing chambers are especially necessary due to the increasing demands that are being placed upon the preciseness at which the semiconductor wafers are heat treated and at which the semiconductor devices are fabricated.

SUMMARY OF THE INVENTION

The present invention recognizes and addresses the foregoing disadvantages and others of prior art constructions and methods.

Accordingly, it is an object of the present invention to provide an improved process and apparatus for determining the temperature of semiconductor wafers in thermal processing chambers using radiation sensing devices.

Another object of the present invention is to provide a system for determining the temperature of a semiconductor wafer in a thermal processing chamber containing a radiation absorbing gas using a radiation sensing device.

Still another object of the present invention to provide a process by which the temperature of a semiconductor wafer is determined in a thermal processing chamber when a radiation absorbing gas is present using a pyrometer in combination with a gas sensing device.

Another object of the present invention is to provide a system for determining the temperature of a semiconductor wafer in a thermal processing chamber which includes a radiation sensing device for sensing thermal radiation being emitted by the wafer and a gas sensing device for sensing the amount of a gas, such as a liquid vapor, contained in the chamber. Wherein by knowing the amount of gas contained in the chamber, a correction factor can be calculated for determining the temperature of the wafer based on information received from the radiation sensing device.

These and other objects of the present invention are achieved by providing an apparatus adapted to monitor the temperature of semiconductor wafers while heating the wafers in an atmosphere containing a radiation absorbing gas. The apparatus includes a thermal processing chamber adapted to contain a semiconductor wafer. A heating device is placed in communication with the thermal processing chamber for heating a wafer contained in the chamber. The heating device, for instance, can be a plurality of light energy sources such as lamps that emit light energy into the chamber.

A radiation sensing device can be placed within the chamber for sensing thermal radiation being emitted by the semiconductor wafer at a predetermined wavelength. A gas sensing device can also be contained in the chamber for sensing the amount of gas present in the atmosphere surrounding the wafer. A controller, such as a microprocessor, can be placed in communication with the radiation sensing device and the gas sensing device. The controller can be configured to calculate the temperature of the semiconductor wafer based on information received from the radiation sensing device and the gas sensing device. In particular, the controller can use the information received from the gas sensing device to calculate a correction factor which accounts for thermal radiation being absorbed by the gas. The temperature of the wafer can then be calculated using the correction factor in combination with the amount of thermal radiation that is sensed by the radiation sensing device.

The radiation sensing device used in the present invention can be, for instance, a pyrometer. In one embodiment, a plurality of radiation sensing devices can be present within the chamber for sensing thermal radiation being emitted by the wafer at a plurality of locations. Each of the radiation sensing devices can be in communication with the controller for more accurately determining the temperature of the wafer.

When the heating device used to heat the wafer is a plurality of lamps, preferably the lamps are separated from the thermal processing chamber by a window. The window can be used to filter light energy entering the chamber. For instance, the window can substantially prevent light at the wavelength at which the radiation sensing devices operate from entering the chamber. For example, in one embodiment, the window can be made from quartz which is known to effectively absorb light at a wavelength of about 2.7 microns.

As described above, a controller is used to calculate the temperature of the wafer based on information received from the radiation sensing device and the gas sensing device. In one embodiment, the controller can also be configured to control the amount of heat being emitted by the heating device. In particular, the controller can control the amount of heat being emitted by the heating device based upon the calculated temperature of the wafer for heating the wafer according to a preset temperature regime.

These and other objects of the present invention are also achieved by providing a process for determining the temperature of a semiconductor wafer in a thermal processing chamber during the presence of a gas, such as a liquid vapor. The process includes the steps of placing a semiconductor wafer in a thermal processing chamber and heating the wafer in the presence of a gas. A radiation sensing device is used to sense thermal radiation being emitted by the wafer while a gas sensing device is used to sense the amount of gas present in the chamber. Based upon the amount of gas sensed by the gas sensing device, a correction factor is determined. The temperature of the semiconductor wafer is then calculated based upon the amount of thermal radiation sensed by the radiation sensing device and the correction factor.

In one embodiment, the process of the present invention is particularly adapted to determine the temperature of the semiconductor wafer when water vapor is present within the chamber. In this embodiment, the gas sensing device can be a water vapor sensing device.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figure in which.

Figure 1:
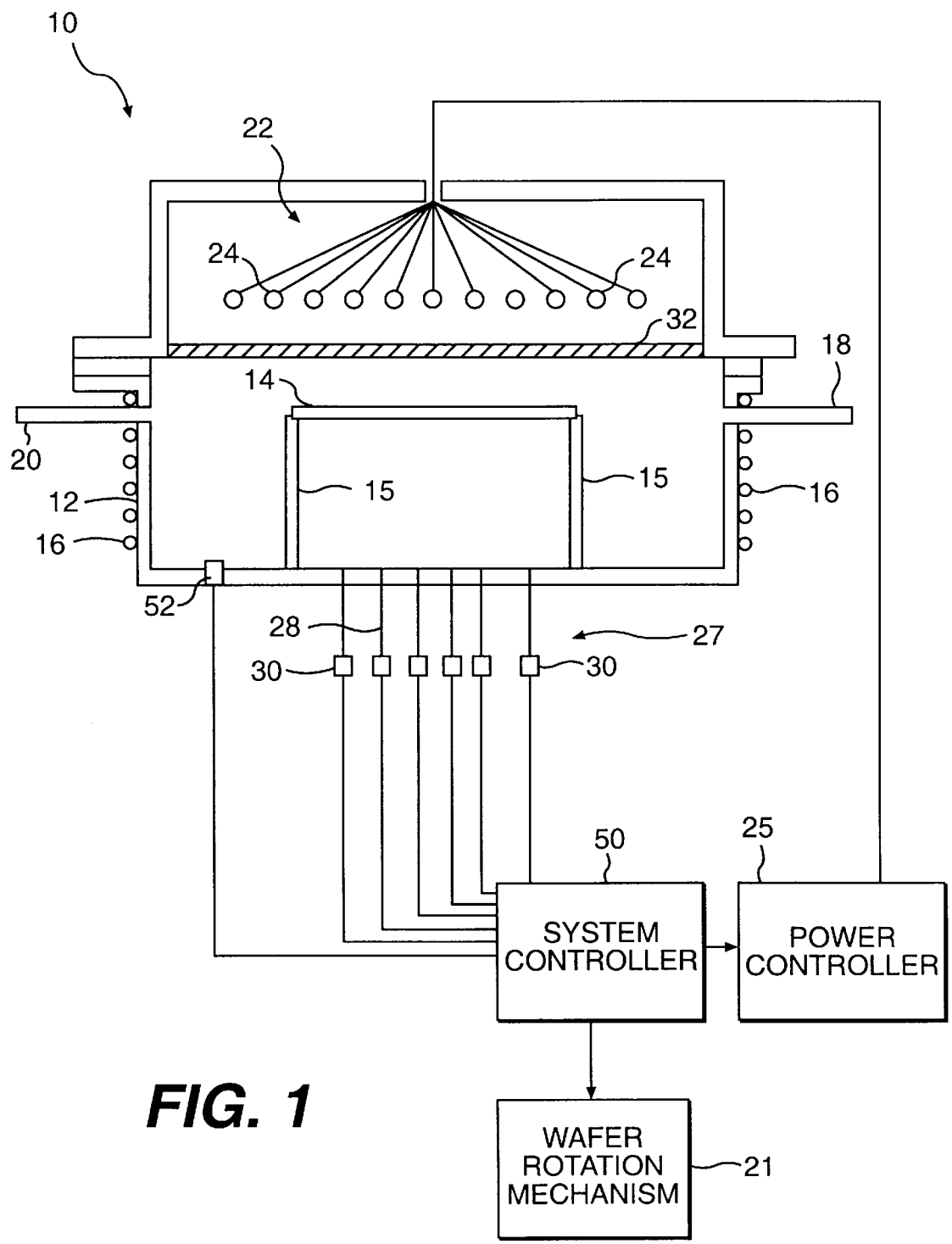
FIG. 1 is a cross-sectional view of one embodiment of a thermal processing chamber made in accordance with the present invention.

Repeat use of references characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to an apparatus and method for heating semiconductor wafers uniformly and at a controlled rate to a target temperature. The apparatus includes a thermal processing chamber in communication with a heating device that is used to heat treat semiconductor wafers contained in the chamber. Besides heating the wafers, the thermal processing chamber is also adapted to circulate gases within the chamber which, for instance, can react with the surface of the wafer for forming various coatings and films. For example, in one embodiment, steam can be introduced into the chamber for forming oxidation coatings on the wafer or alternatively to enhance the characteristics of the films that are being deposited or grown.

More particularly, the present invention is directed to a system for monitoring the temperature of a semiconductor wafer in a thermal processing chamber using a radiation sensing device in the presence of a radiation absorbing gas, such as a liquid vapor. Specifically, besides a radiation sensing device, the system of the present invention includes a gas sensing device which senses the amount of gas present in the chamber. Based upon the amount of gas present in the chamber, a correction factor is determined for correcting for the amount of thermal radiation that is absorbed by the gas and which is not detected by the radiation sensing device. Using the correction factor in combination with the amount of thermal radiation being sensed by the radiation sensing device, the temperature of the semiconductor wafer within the chamber can be more accurately determined. In one embodiment, the present invention is directed to a system designed to monitor the temperature of a semiconductor wafer in the presence of water vapor or steam.

Referring to FIG. 1, a system generally 10 made in accordance with the present invention for heat treating a wafer made from a semiconductive material, such as silicon, is illustrated. System 10 includes a processing chamber 12 adapted to receive substrates such as a wafer 14 for conducting various processes. As shown, wafer 14 is positioned on a substrate holder 15 made from a thermal insulating material such as quartz. Chamber 12 is designed to heat wafer 14 at very rapid rates and under carefully controlled conditions. Chamber 12 can be made from various materials, including metals and ceramics. For instance, chamber 12 can be made from stainless steel or quartz.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 also includes an inlet 18 and an outlet 20 for introducing liquids and gases into the chamber and/or for maintaining the chamber within a preset pressure range. For instance, a gas or vapor can be introduced into chamber 12 through inlet 18 for reaction with wafer 14. Once processed, the gas can then be evacuated from the chamber using outlet 20. In one embodiment, for example, water vapor can be introduced into chamber 12 for forming an oxidation coating on a wafer. It should be understood, however, that besides water vapor, various other liquid vapors and gases can be introduced into the chamber for reaction with the wafer.

Alternatively, an inert gas can be fed to chamber 12 through inlet 18 for preventing any unwanted or undesirable side reactions from occurring within the chamber.

During processing, substrate holder 15, in one embodiment, can be adapted to rotate wafer 14 using a wafer rotation mechanism 21. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating wafer 14 during processing. Heating device 22 includes a plurality of lamps 24, such as tungsten-halogen lamps. As shown in FIG. 1, lamps 24 are placed above wafer 14. It should be understood, however, that lamps 24 may be placed at any particular location. Further, additional lamps could be included within system 10 if desired, such as below the wafer.

In one embodiment, lamps 24 can be associated with one or more reflectors that assist in directing light energy being emitted by the lamps onto a semiconductor wafer. For instance, each lamp can be placed adjacent to a reflective cavity or a group of lamps can be contained within a reflective cavity. The reflector can be a polished concave surface and/or can include reflective plates which extend adjacent to the lamps.

The use of lamps 24 as a heat source is generally preferred. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the electromagnetic energy being emitted by any of the lamps.

In order to monitor the temperature of wafer 14 during the heating process, thermal processing chamber 12 includes one or a plurality of radiation sensing devices generally 27. Radiation sensing devices 27 include a plurality of optical fibers or light pipes 28 which are, in turn, in communication with a plurality of corresponding light detectors 30. Optionally, light pipes 28 can be connected to a single light detector 30. Optical fibers 28 are configured to receive electromagnetic energy, such as thermal energy or X-ray energy, being emitted by wafer 14 at a particular wavelength. The amount of sensed radiation is then communicated to light detectors 30 which generate a usable voltage signal for determining the temperature of the wafer which can be calculated based, in part, on Planck's Law. In one embodiment, each optical fiber 28 in combination with a light detector 30 comprises a pyrometer.

In general, thermal processing chamber 12 can contain one or a plurality of radiation sensing devices. In a preferred embodiment, as shown in FIG. 1, thermal processing chamber 12 contains a plurality of radiation sensing devices that measure the temperature of the wafer at different locations. Knowing the temperature of the wafer at different locations can then be used to control the amount of heat being applied to the wafer as will be described in more detail hereinafter.

During the process of the present invention, system 10 should be designed such that optical fibers 28 only detect thermal radiation being emitted by wafer 14 and not detect radiation being emitted by lamps 24. In this regard, system 10 includes a filter window 32 which prevents thermal radiation being emitted by lamps 24 at the wavelength at which light detectors 30 operate from entering chamber 12. Filter 32 also serves to isolate lamps 24 from wafer 14 and prevent contamination of the chamber. Filter 32 as shown in FIG. 1 can be a window positioned between chamber 12 and heat source 22. In an alternative embodiment, each lamp 24 can be covered by a separate filter.

In one embodiment, filter 32 is made from fused silica or quartz. Fused silica is known to absorb thermal radiation very effectively at selected wavelengths. For instance, synthetic fused silica is very effective at absorbing light at a wavelength of from approximately 2.7 micrometers to about 2.8 micrometers. Thus, in one embodiment, when filter 32 is made from synthetic fused silica, light detectors 30 can be configured to detect thermal radiation being emitted by wafer 14 at a wavelength of about 2.7 micrometers.

System 10 further includes a system controller 50 which can be, for instance, a microprocessor. Controller 50 receives voltage signals from light detectors 30 that represent the radiation amounts being sampled at the various locations. Based on the signals received, controller 50 is configured to calculate the temperature of wafer 14 at different locations.

System controller 50 as shown in FIG. 1 can also be in communication with lamp power controller 25. In this arrangement, controller 50 can determine the temperature of wafer 14, and, based on this information, control the amount of thermal energy being emitted by lamps 24. In this manner, instantaneous adjustments can be made regarding the conditions within reactor 12 for processing wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

In accordance with the present invention, system 10 further contains a gas sensing device 52 which can also be placed in communication with system controller 50. Gas sensing device 52 is designed to detect the amount of a radiation absorbing gas contained within thermal processing chamber 12. As described above, when present within thermal processing chamber 12, a gas, such as a vapor, can absorb thermal radiation being emitted by the wafer yielding slight errors in the temperature measurement of the wafer based upon readings taken by the radiation sensing devices. In accordance with the present invention, gas sensing device 52 is provided in order to correct for the presence of the gas.

For instance, system controller 50 can be preprogrammed with a predetermined absorption relationship that connects the concentration of the absorbing gas as determined by gas sensing device 52 to signal attenuation by the presence of the gas. The predetermined absorption relationship can be constructed empirically, theoretically, or in any combination. In this manner, once the gas concentration within the chamber is sensed by gas sensing device 52, a correction factor can be determined from the predetermined relationship. The correction factor can then be used as a multiplication factor in combination with the raw data received from the radiation sensing devices in order to determine the temperature of the semiconductor wafer. The correction factor can be determined statically or dynamically in real-time during processing.

Besides containing a single gas sensing device 52 as shown in FIG. 1, the system of the present invention can also contain a plurality of gas sensing devices. For instance, in one embodiment, a plurality of gas sensing devices can be used to sense the amount of a particular gas at a plurality of locations within the chamber. Alternatively, or in addition to the above embodiment, the chamber can contain multiple gas sensing devices which sense different gases within the chamber. For example, in some processes, more than one radiation-absorbing gas may be present. Different gas sensing devices can be used to sense the concentration of different gases and communicate such information to the controller. The controller can then be configured to calculate a correction factor based upon the presence of the various gases.

Although the system of the present invention can be designed to compensate for most any gas or vapor that may be present in the chamber, in one embodiment, the present invention is particularly well suited for compensating for the presence of water vapor or steam. Water vapor can be introduced into thermal processing chamber 12 in order to form or facilitate the formation of oxidation coatings or other films on semiconductor wafer 14. The water vapor can be injected directly into the chamber or can be reactively formed in the chamber. Of particular disadvantage, water molecules are known to absorb thermal radiation at a wavelength of 2.7 microns which is the same wavelength that many pyrometers operate at, especially if window 32 is made from quartz. According to the present invention, however, by sensing the amount of water vapor within the chamber using vapor sensing device 52, the presence of water vapor can be accounted for in the determination of the temperature of the wafer.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A process for determining the temperature of a semiconductor wafer in a thermal processing chamber during the presence of a gas, said process comprising the steps of:
    placing a semiconductor wafer in a thermal processing chamber;
    heating said semiconductor wafer in said thermal processing chamber in the presence of a radiation absorbing gas;
    sensing electromagnetic radiation being emitted by said wafer at a determined wavelength using a temperature sensing device;
    sensing the amount of said gas present in said thermal processing chamber using a gas sensing device;
    determining a correction factor based on the amount of gas sensed by said gas sensing device, said correction factor accounting for the amount of radiation being emitted by the wafer that is absorbed by the gas and not detected by the temperature sensing device; and
    calculating the temperature of said semiconductor wafer based on the amount of electromagnetic radiation sensed by said temperature sensing device and said correction factor.

2. A process as defined in claim 1, wherein said semiconductor wafer is heated by a plurality of light energy sources.

3. A process as defined in claim 2, further comprising the step of controlling the amount of heat being emitted by said plurality of light energy sources in response to the calculated temperature of the semiconductor wafer in order to heat the wafer according to a preset temperature regime.

4. A process as defined in claim 2, further comprising the step of filtering light energy being emitted by said plurality of light energy sources prior to said light energy entering said thermal processing chamber, said light energy being filtered by placing a quartz window in between said light energy sources and said thermal processing chamber, said quartz window substantially preventing light energy at said determined wavelength from entering said chamber.

5. A process as defined in claim 4, wherein said determined wavelength is about 2.7 microns.

6. A process as defined in claim 1, wherein said gas sensing device senses the amount of water vapor present in said thermal processing chamber.

7. A process for determining the temperature of a semiconductor wafer in a thermal processing chamber during the presence of water vapor, said process comprising the steps of:
    placing a semiconductor wafer in a thermal processing chamber;
    heating said semiconductor wafer in said thermal processing chamber in the presence of water vapor;
    sensing electromagnetic radiation being emitted by said wafer at a determined wavelength using a temperature sensing device;
    sensing the amount of said water vapor present in said thermal processing chamber using a water vapor sensing device;
    determining a correction factor based on the amount of water vapor sensed by said water vapor sensing device, said correction factor accounting for the amount of radiation being emitted by the wafer that is absorbed by the water vapor and not detected by the temperature sensing device; and
    calculating the temperature of said semiconductor wafer based on the amount of electromagnetic radiation sensed by said temperature sensing device and said correction factor.

8. A process as defined in claim 7, wherein said semiconductor wafer is heated by a plurality of light energy sources.

9. A process as defined in claim 8, further comprising the step of controlling the amount of heat being emitted by said plurality of light energy sources in response to the calculated temperature of the semiconductor wafer in order to heat the wafer according to a preset temperature regime.

10. A process as defined in claim 8, further comprising the step of filtering light energy being emitted by said plurality of light energy sources prior to said light energy entering said thermal processing chamber, said light energy being filtered by placing a quartz window in between said light energy sources and said thermal processing chamber, said quartz window substantially preventing light energy at said determined wavelength from entering said chamber.

11. A process as defined in claim 10, wherein said determined wavelength is about 2.7 microns.

* * * * *

UNITED STATES PATENT AND TRADEMARK OFFICE
CERTIFICATE OF CORRECTION

PATENT NO : 6,034,357
DATED : March 7, 2000
INVENTOR(S): Julio Guardado

It is certified that error appears in the above-identified patent and that said Letters Patent is hereby corrected as shown below:

Please add Assignee
    On the title page, item [73]

Steag RTP Systems, Inc.
    San Jose, California

Signed and Sealed this

Twenty-seventh Day of March, 2001

*Attest:*

NICHOLAS P. GODICI

*Attesting Officer*      *Acting Director of the United States Patent and Trademark Office*